United States Patent
Koyama

(10) Patent No.: US 7,557,848 B2
(45) Date of Patent: Jul. 7, 2009

(54) SOLID-STATE IMAGE PICKUP DEVICE INCLUDING SWITCHED CAPACITOR AMPLIFIER

(75) Inventor: Eiji Koyama, Souraku-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 880 days.

(21) Appl. No.: 11/072,029

(22) Filed: Mar. 3, 2005

(65) Prior Publication Data

US 2005/0195306 A1 Sep. 8, 2005

(30) Foreign Application Priority Data

Mar. 4, 2004 (JP) .............................. P2004-060635

(51) Int. Cl.
 H04N 3/14 (2006.01)
 H01L 31/062 (2006.01)
 H01L 27/00 (2006.01)
(52) U.S. Cl. .................... 348/308; 348/301; 257/292; 250/208.1
(58) Field of Classification Search ................. 348/308, 348/301, 300, 311; 257/291, 292; 377/58, 377/60; 250/208.1
See application file for complete search history.

(56) References Cited

U.S. PATENT DOCUMENTS

| | | | | |
|---|---|---|---|---|
| 5,192,920 A | * | 3/1993 | Nelson et al. | 377/59 |
| 5,220,587 A | * | 6/1993 | Takemoto et al. | 377/58 |
| 5,280,511 A | * | 1/1994 | Fujii et al. | 377/60 |
| 5,287,393 A | * | 2/1994 | Miwada | 377/60 |
| 5,471,246 A | * | 11/1995 | Nishima et al. | 348/311 |
| 5,508,646 A | * | 4/1996 | Cortiula | 377/60 |
| 5,767,902 A | * | 6/1998 | Koyama | 348/311 |
| 5,990,951 A | * | 11/1999 | Koyama | 348/302 |
| 6,147,556 A | * | 11/2000 | Nakano | 330/277 |
| 6,316,760 B1 | * | 11/2001 | Koyama | 348/294 |
| 6,980,244 B1 | * | 12/2005 | Yonemoto et al. | 348/302 |
| 7,414,653 B2 | * | 8/2008 | Fowler et al. | 348/308 |

FOREIGN PATENT DOCUMENTS

| | | |
|---|---|---|
| JP | 6-164263 A | 6/1994 |
| JP | 06-216385 | 8/1994 |
| JP | 09-130681 | 5/1997 |
| JP | 2000-036589 | 2/2000 |
| JP | 3415775 | 6/2003 |
| JP | 3439581 | 8/2003 |

* cited by examiner

*Primary Examiner*—Nhan T Tran
(74) *Attorney, Agent, or Firm*—Edwards Angell Palmer & Dodge LLP; David G. Conlin; David A. Tucker

(57) ABSTRACT

A solid-state image pickup device includes a detection diode for detecting a transfer charge and a switched capacitor amplifier whose input section is connected to the detection diode. The switched capacitor amplifier includes an inverting amplifier, a reset transistor and a feedback capacitor which are connected between input and output sections of the inverting amplifier. Thus, the solid-state image pickup device satisfies the requirements for both improvement in charge-voltage conversion efficiency and reduction in generated noises.

2 Claims, 9 Drawing Sheets

SOLID-STATE IMAGE PICKUP DEVICE INCLUDING SWITCHED CAPACITOR AMPLIFIER

CROSS-REFERENCE TO RELATED APPLICATIONS

This nonprovisional application claims priority under 35 U.S.C. §119(a) on patent application Ser. No. 2004-060635 filed in Japan on Mar. 4, 2004, the entire contents of which are incorporated herein by reference.

BACKGROUND OF THE INVENTION

The present invention relates to solid-state image pickup devices including semiconductor image sensors of, for example, CCD (Charge Coupled Device) type image sensors.

The semiconductor image sensors such as CCD type image sensors, MOS type image sensors, etc. are presently applied to most of image input devices. In recent years, the MOS (Metal Oxide Semiconductor) type image sensors have been reevaluated since the sensors have the advantages that the power consumption is small and that the sensors can be formed by using the same CMOS (Complementary MOS) technology as that for the peripheral circuits. On the other hand, in terms of image quality, the CCD type image sensors have been still widely applied to image input devices intended for high resolution since dark current and/or fixed pattern noises are low.

FIG. 8 shows a circuit of the charge detection section in a conventional CCD type image sensor. The conventional CCD type image sensor includes a horizontal CCD 101 that transfers a signal charge, a detection diode 102 that converts the charge transferred by the horizontal CCD 101 into a voltage with use of a detection capacitor 103 (value thereof: $C_{FD}$), a source follower circuit 104 whose input section is connected to the detection diode 102, and a reset transistor 105 that discharges the transfer charge from the horizontal CCD 101 to a reset drain RD. The source follower circuit 104 includes an amplification transistor 106 and a constant-current load transistor 107.

In the CCD type image sensor, subsequently to the source follower circuit 104, an output circuit, which includes an amplifier for output impedance conversion and so on, is connected so as to output signals to the outside of chip. However, the output circuit is not shown in the circuit diagram of FIG. 8.

Explanation is hereinbelow given as to operations per pixel cycle (1CLK (clock)) of the conventional CCD type image sensor. As shown in FIGS. 8 and 9, φH1 is at High level during a time T1. Therefore, no charge is transferred from the horizontal CCD 101 to the detection diode 102. As a result, the transfer charge is accumulated under the φH1 gate. On the other hand, φR is also at High level, and thereby a voltage of the detection diode 102 is fixed to a voltage of the reset drain RD.

During a time T2, φR is at Low level, and thereby the voltage of the detection diode 102 enters a floating state.

During a time T3, φH1 is at Low level, and thereby the charge accumulated under the φH1 gate is transferred under an output gate OG to the detection diode 102. The transferred charge is converted into a voltage with use of the detection capacitor 103 in the detection diode 102.

If a difference signal between the time T2 and the time T3 is read by a subsequent clamp circuit, differential amplifier, CDS (Correlated Double Sampling) circuit or the like, then an effective signal is read. Given that the transfer charge is Qsig, an output voltage Vsig is expressed as:

$$V\text{sig} = G \cdot Q\text{sig}/C_{FD} \qquad \text{(Ex. 1)}$$

where $C_{FD}$ represents the value of the detection capacitor, and G represents the gain of the source follower circuit, the gain having a value of about 0.8 to 0.9.

Generally, a voltage of about 1 V is applied to the output gate OG, a voltage of about 12 V is applied to the reset drain RD and the output drain OD, and a direct-current voltage of about 0.8 V is applied as a bias.

However, the conventional CCD type image sensor causes the following problems as to the construction and operation thereof. That is, given that $C_{FD}$ is a value of the detection capacitor 103 detected by detection diode 102, when signal charge Qsig from the horizontal CCD 101 is converted to a voltage signal Vsig, a charge-voltage conversion efficiency η is expressed as:

$$\eta = V\text{sig}/Q\text{sig} = G/C_{FD} \qquad \text{(Ex. 2)}$$

In the source follower circuit 104, the gain G is about 0.8 to 0.9. Therefore, so long as the circuit is the source follower circuit, the gain cannot be higher than 1.0. As the result, in order to enlarge the charge-voltage conversion efficiency η, the value $C_{FD}$ of the detection capacitor 103 needs to be reduced. $C_{FD}$ is a sum of a source junction capacitance of the reset transistor 105, a gate capacitance of the amplification transistor 106 and a junction capacitance to the substrate. However, the value of the gate capacitance of the amplification transistor 106 is dominative. Therefore, in order to reduce the gate capacitance of the amplification transistor 106, the size of the amplification transistor 106 is designed to be reduced as far as possible.

Meanwhile, the power of thermal noises and 1/f noises generated in the amplification transistor 106 are respectively expressed per unit frequency as:

$$\text{thermal noise power} \propto 1/gm \propto 1/\sqrt{(C\text{ox}W/L)} \qquad \text{(Ex. 3)}$$

$$1/f \text{ noise power} \propto 1/(C\text{ox}LW) \qquad \text{(Ex. 4)}$$

In the above expressions, gm represents the transconductance of the amplification transistor 106, W represents the gate width of the amplification transistor 106, L represents the gate length of the amplification transistor 106, and Cox represents a gate oxide film capacitance per unit area.

That is, the noises tend to relatively increase when the size of the amplification transistor 106 is reduced.

Accordingly, in order to reduce the noise components, a method for enlarging Cox by reducing the thickness of the oxide film is proposed (refer to JP H06-216385A).

However, when Cox is enlarged, the gate capacitance increases. Thereby, the charge-voltage conversion efficiency η is reduced on the contrary. That is to say, improvement in the charge-voltage conversion efficiency η and reduction in the noises generated in the amplification transistor 106 have a trade-off relationship.

SUMMARY OF THE INVENTION

An object of the present invention is to provide a solid-state image pickup device of noise-reduced high-quality images which solves the above problems.

In order to solve the above problems, the present invention provides a solid-state image pickup device comprising:

a plurality of photoelectric conversion elements;

a plurality of charge transfer elements for transferring photoelectric charge generated in the plurality of photoelectric conversion elements;

a detection diode for detecting the photoelectric charge transferred by the plurality of charge transfer elements; and a switched capacitor amplifier whose input section is connected to the detection diode.

According to the solid-state image pickup device of the present invention, the switched capacitor amplifier is provided whose input section is connected to the detection diode. Thereby, the charge-voltage conversion efficiency for converting the transferred charge to the voltage does not depend on the detection capacitance detected by the detection diode. Therefore, it becomes possible to freely select, for example, gate size of the amplification transistor in the switched capacitor amplifier, which gate is a main factor of the detection capacitance detected by the detection diode. This makes it possible to provide a design that takes into consideration the thermal noises and the 1/f noises of the amplification transistor. Furthermore, it becomes possible to improve the charge-voltage conversion efficiency by reducing the value of the feedback capacitance included in the switched capacitor amplifier. Thus, it becomes possible to obtain a high-quality image signal having reduced noises.

In the solid-state image pickup device of one embodiment of the present invention, the switched capacitor amplifier includes:

an inverting amplifier whose input section is connected to the detection diode;

a reset transistor connected between an input section and an output section of the inverting amplifier; and a capacitor connected between the input section and the output section of the inverting amplifier and parallel to the reset transistor.

According to the solid-state image pickup device of the embodiment, the switched capacitor amplifier is provided in a simple construction. Moreover, the thermal noises and the 1/f noises of the amplification transistor are reduced by enlarging the gate size of the amplification transistor included in the inverting amplifier. The charge-voltage conversion efficiency is improved by reducing the capacitance value.

In the solid-state image pickup device of one embodiment of the present invention, the inverting amplifier is a gate-grounded type inverting amplifier.

According to the solid-state image pickup device of the embodiment, since the gate-grounded type inverting amplifier is used, it is possible to increase gain i.e. a change of the output with respect to a change of the input. Thereby, the charge-voltage conversion efficiency does not depend on the detection capacitance detected by the detection diode at all. Thus, low noise and high resolution can reliably be achieved.

In the solid-state image pickup device of one embodiment of the present invention, a load side element of the inverting amplifier is a constant-current load transistor.

According to the solid-state image pickup device of the embodiment, a large load resistance of not smaller than tens of kilo-ohms can be simply obtained since the constant-current load transistor is employed. Since the gain of the gate-grounded type amplifier is the product of the transconductance of the amplification transistor and the load resistance, it is possible to reliably increase the gain by the large load resistance.

In the solid-state image pickup device of one embodiment of the present invention, the load side element of the inverting amplifier is a high resistance resistor.

According to the solid-state image pickup device of the embodiment, since the high resistance (for example, N-resistance, N-well resistance, etc.) is employed, it is also possible to achieve a large resistance which cannot be achieved by the constant-current load transistor. That is, since the CCD is generally constructed only of Nch (N-channel) transistors, it is not necessary to newly provide a Pch (P-channel) transistor for only the present circuit.

In the solid-state image pickup device of one embodiment of the present invention, the load side element of the inverting amplifier is a load transistor whose gate and drain are connected together.

According to the solid-state image pickup device of the embodiment, since the gate-drain connection transistor load is employed for the load side element, both the amplification transistors and the load transistors can be constructed of Nch transistors. Thereby, a Pch transistor is unnecessary. Since the CCD is generally constructed only of Nch transistors, it is not necessary to newly provide a Pch transistor for only the present circuit. In addition, fluctuations in processes are reduced in comparison with the case of the high resistance resistor.

In the solid-state image pickup device of one embodiment of the present invention, the inverting amplifier is a cascode type inverting amplifier.

According to the solid-state image pickup device of the embodiment, since the cascode type inverting amplifier is employed, the gain is further increased. Thereby, the charge-voltage conversion efficiency does not receive the influence of the detection capacitance detected by the detection diode at all. Therefore, low noise and high resolution can reliably be achieved.

In the solid-state image pickup device of one embodiment of the present invention, the solid-state image pickup device further comprises a gate application pulse generation circuit for generating a gate application pulse of the reset transistor.

According to the solid-state image pickup device of the embodiment, it becomes possible to generate the application pulse on which the direct-current voltage is superimposed from the input pulse on which no direct-current voltage is superimposed. As a result, the inverting amplifier can reliably be short-circuited between the input and output thereof.

In the solid-state image pickup device of one embodiment of the present invention, the gate application pulse generation circuit includes:

a second inverting amplifier of a structure identical to that of the inverting amplifier of the switched capacitor amplifier; and a second reset transistor of a structure identical to that of the reset transistor of the switched capacitor amplifier.

According to the solid-state image pickup device of the embodiment, the direct-current voltage superimposed by the gate application pulse generation circuit receives the influences of processing fluctuations, power voltage fluctuations, temperature changes and so on in exactly the same way as the inverting amplifier and the reset transistor of the switched capacitor amplifier connected to the detection diode. Thereby, the optimum direct-current voltage is consistently superimposed, which assures satisfactory operation.

In the solid-state image pickup device of one embodiment of the present invention, an input section and an output section of the second inverting amplifier are connected together, a drain and a gate of the second reset transistor are connected together, the drain and a source of the second reset transistor are connected together through a high resistance resistor, the output section of the second inverting amplifier and the source of the second reset transistor are connected together, and the gate of the reset transistor of the switched capacitor amplifier is connected to the drain of the second reset transistor.

According to the solid-state image pickup device of the embodiment, the gate application pulse generation circuit is realized in a simple construction.

According to the solid-state image pickup device of the present invention, where the input section of the switched capacitor amplifier is connected to the detection diode, the charge-voltage conversion efficiency does not depend on the detection capacitance detected by the detection diode by employing the switched capacitor amplifier as an output circuit. With this arrangement, it is possible to achieve both of improvement in the charge-voltage conversion efficiency and reduction in the noises, which has conventionally been difficult. This makes it possible to provide a solid-state image pickup device of noise-reduction and high-resolution.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, the present invention is described in detail by reference to embodiments shown in the accompanying drawings.

First Embodiment

Figure 1:
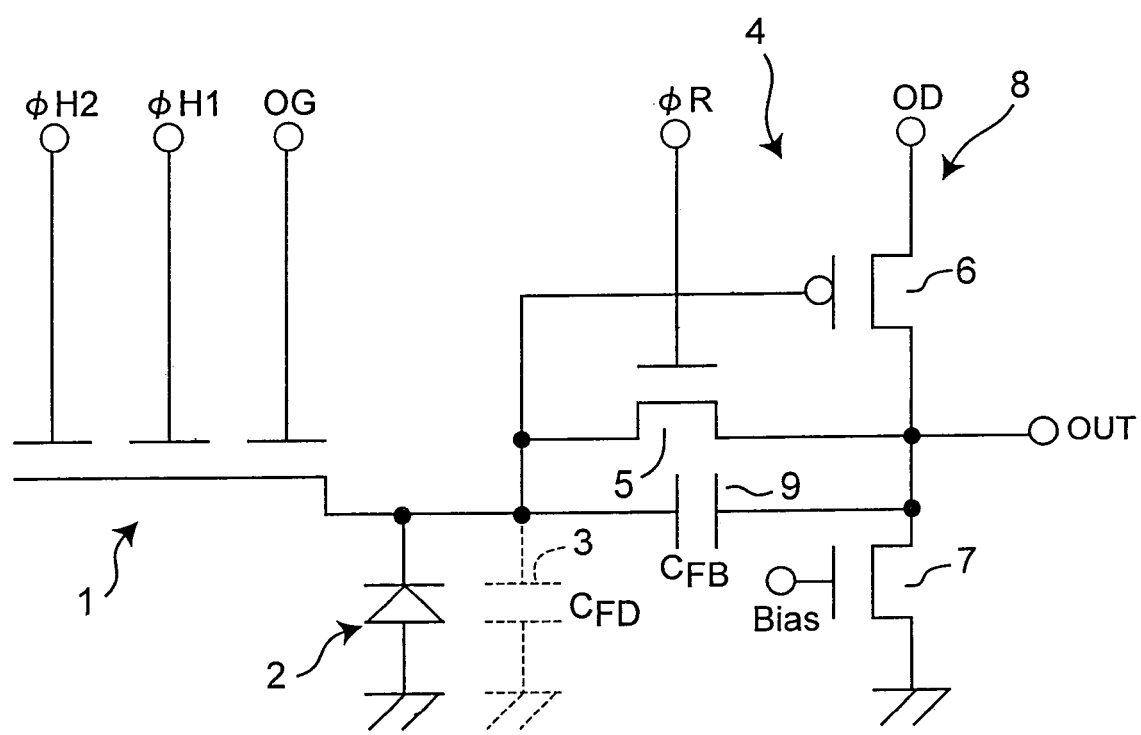
FIG. 1 is a circuit diagram showing a solid-state image pickup device according to a first embodiment of the present invention.

FIG. 1 shows a circuit diagram of a solid-state image pickup device according to an embodiment of the present invention. The solid-state image pickup device is a CCD type image sensor and includes a plurality of photoelectric conversion elements (not shown), a horizontal CCD 1 (an example of the photoelectric charge transfer element) that transfers photoelectric charge (signal charge) generated in the plurality of photoelectric conversion elements, a detection diode 2 that converts the charge transferred by the horizontal CCD 1 to a voltage by using a detection capacitor 3 and a switched capacitor amplifier 4 whose input section is connected to the detection diode 2.

Subsequently to the switched capacitor amplifier 4, although not shown in the circuit diagram of FIG. 1, an amplifier for output impedance conversion and so on are additionally connected so as to output signals to the outside of chip.

The switched capacitor amplifier 4 includes an inverting amplifier 8 whose input section is connected to the detection diode 2, a reset transistor 5 connected between an input section and an output section of the inverting amplifier 8 and a feedback capacitor 9 connected between the input and output sections of the inverting amplifier 8 and parallel to the reset transistor 5.

The inverting amplifier 8 is a gate-grounded type inverting amplifier that has a Pch (P-channel) amplification transistor 6 and an Nch (N-channel) constant-current load transistor 7.

Figure 2:
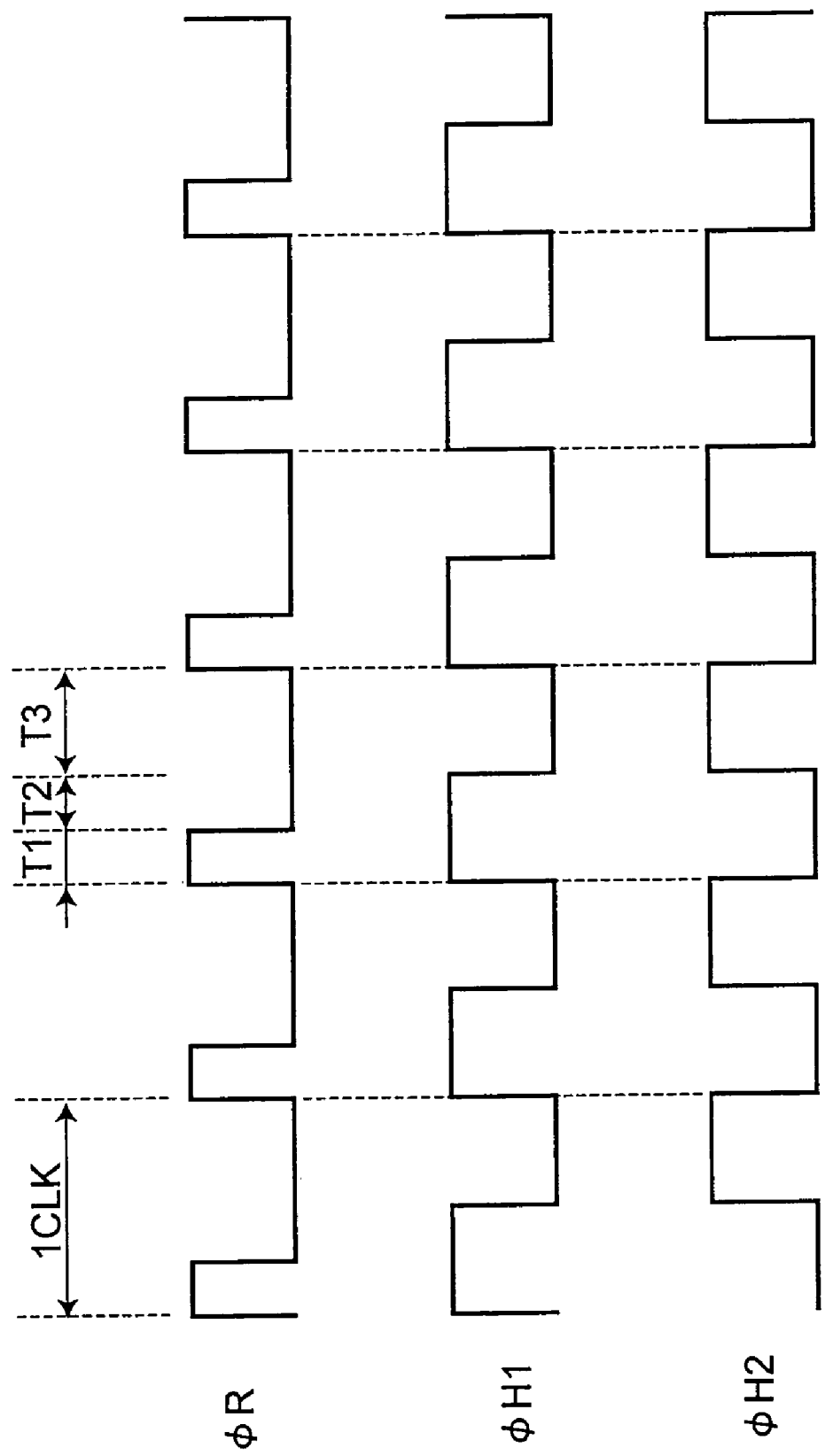
FIG. 2 is a timing chart of drive pulses of FIG. 1.

Next, with reference to FIGS. 1 and 2, the operation of the solid-state image pickup device of the present invention per pixel cycle (1CLK (one clock)) is described. FIG. 2 is a timing chart for explaining the operation of the circuit shown in FIG. 1.

During a period T1, φR applied to the gate of the reset transistor 5 of the switched capacitor amplifier 4 is at High level, which causes short-circuiting between the input and output sections of the inverting amplifier 8 that has the amplification transistor 6 and the constant-current load transistor 7. Thereby, the voltage of the detection diode 2 is reset to a constant voltage Vo.

Figure 3:
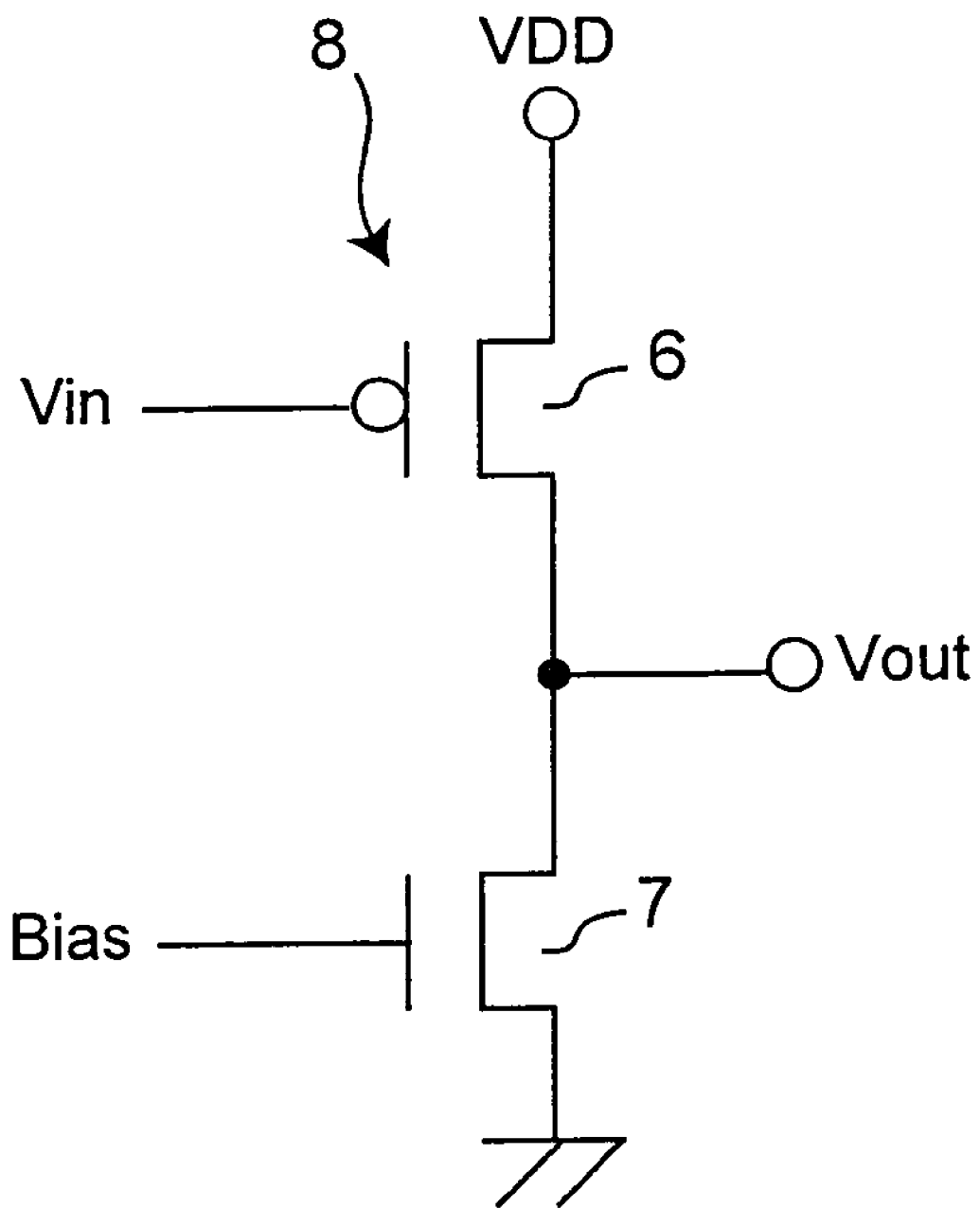
FIG. 3 is a circuit diagram of an inverting amplifier of FIG. 1.
Figure 4:
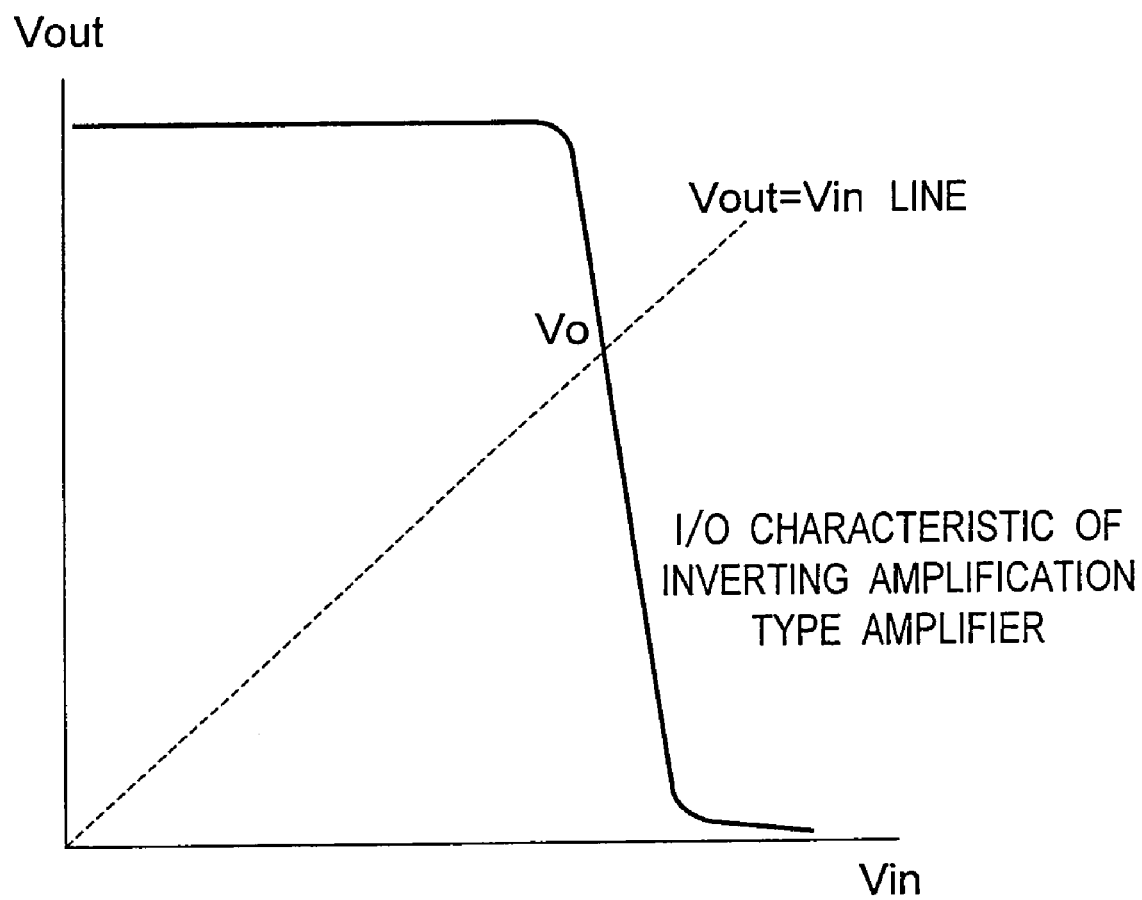
FIG. 4 is a graph showing the characteristic of the inverting amplifier of FIG. 1.

Herein is described the reason why the voltage of the detection diode 2 is reset to the constant voltage Vo at the time of the short-circuiting between the input and output sections of the inverting amplifier 8. FIG. 3 shows a circuit diagram of the inverting amplifier 8. FIG. 4 shows the characteristic of the inverting amplifier 8. When short-circuiting is generated between the input and output sections of the inverting amplifier 8, as shown in FIG. 4, an intersecting point of the characteristic curve (solid line) of the inverting amplification type amplifier with a straight line (dashed line) of Vout=Vin becomes Vo. Thereby, the detection diode 2 is reset to the voltage Vo.

During a period T2, φR is at Low level, which causes turn-off of the reset transistor 5. Thereby, the voltage of the detection diode 2 becomes an electric-potentially floating state, and is inverted and amplified so that an output of the voltage of the detection diode 2 is read. During this time, the charge transfer from the horizontal CCD 1 is not performed.

During a period T3, φH1 is at Low level, so that the charge transferred by the horizontal CCD 1 goes beyond the output gate OG and is read by the detection diode 2, and thereby the voltage of the detection diode 2 is lowered. At the same time, an output obtained by inverting and amplifying the lowered voltage of the detection diode 2 is read.

Based on the above operation, an effective signal is read when a difference signal between the period T2 and T3 is taken by a clamp circuit, differential amplifier, CDS circuit and the like which are subsequently provided. Further, adoption of CDS operation suppresses reset noises generated at the time of resetting and low-frequency noises generated in the amplification section. Generally, the voltage at the output gate OG is a direct-current voltage of about 1 V, and a power voltage of about 12 V is applied to the output drain OD.

In this case, given that the quantity of charge transferred from the horizontal CCD 1 is Qsig and that the gain of the inverting amplifier 8 is A, an effective signal Vsig to be read is expressed as:

$$V\text{sig} = A \cdot Q\text{sig}/[C_{FD} + (1+A)C_{FB}] \qquad \text{(Ex.5)}$$

where $C_{FD}$ is the value of the detection capacitor detected by the detection diode 2, and $C_{FB}$ is the value of the feedback capacitor.

In this case, the gain A of the inverting amplifier 8 is expressed as:

$$A = gm \cdot (rop // ron) \quad \text{(Ex. 6)}$$

where gm is the transconductance of the amplification transistor 6, rop is the output resistance of the amplification transistor 6, and ron is the output resistance of the constant-current load transistor 7.

Moreover, when the amplification gain A is very large, the signal Vsig is expressed as:

$$Vsig \approx Qsig/C_{FB} \quad \text{(Ex. 7)}$$

Then the charge-voltage conversion efficiency η is expressed as:

$$\eta = Vsig/Qsig = 1/C_{FB} \quad \text{(Ex. 8)}$$

That is to say, it is indicated that the outputted signal Vsig does not depend on the value $C_{FD}$ Of the detection capacitor. Thus it is not necessary to reduce the detection capacitor's value $C_{FD}$ in order to raise the charge-voltage conversion efficiency η. Thereby, the degrees of freedom increase in the amplifier design, which consequently allows the amplifier design to take thermal noises and 1/f noises into account. It is, of course, possible to increase i.e. improve the charge-voltage conversion efficiency η by reducing the detection capacitor's value $C_{FD}$.

A high resistance resistor may also be used though the load of the inverting amplifier 8 has been provided by the constant-current load transistor in this embodiment.

Figure 5:
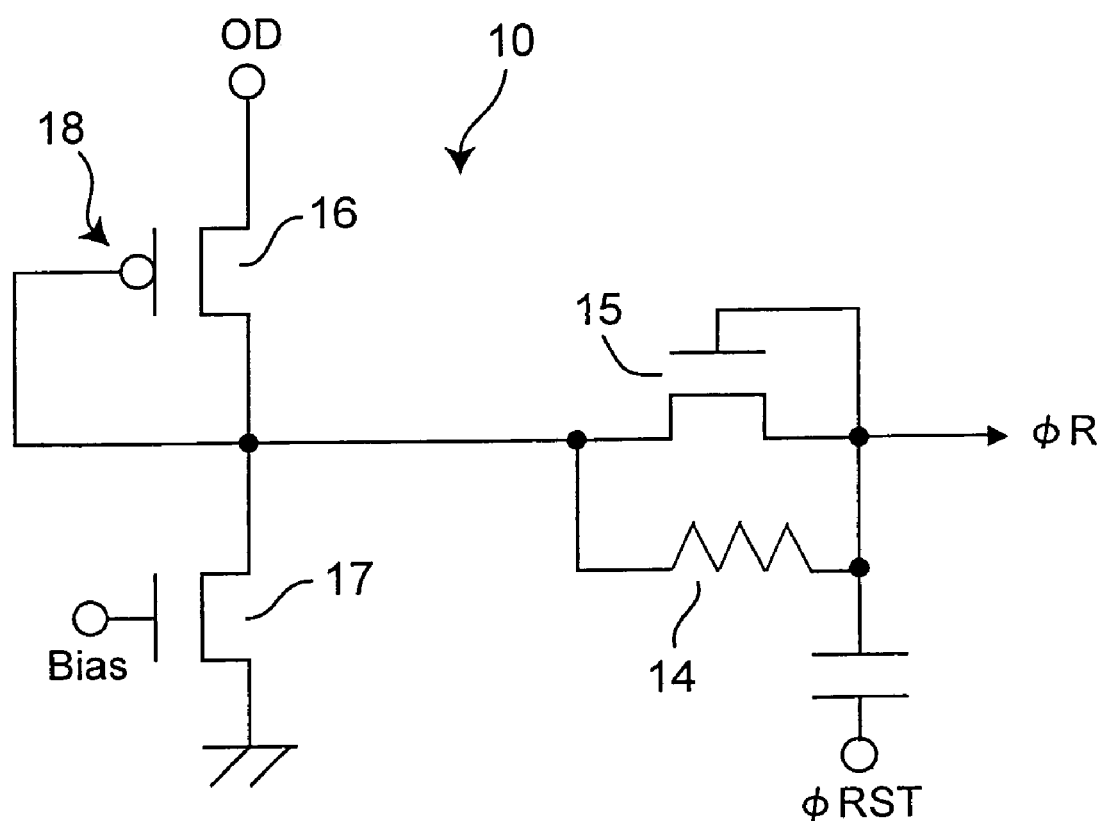
FIG. 5 is a circuit diagram for generating a reset pulse of FIG. 1.

FIG. 5 is a circuit diagram showing a gate application pulse generation circuit for generating a pulse φR that is applied to the gate of the reset transistor 5. The gate application pulse generation circuit 10 has a second inverting amplifier 18 that has a structure identical to that of the inverting amplifier 8 of the switched capacitor amplifier 4 shown in FIG. 1 and a second reset transistor 15 that has a structure identical to that of the reset transistor 5 of the switched capacitor amplifier 4 shown in FIG. 1.

The second inverting amplifier 18 has a second amplification transistor 16 that has a structure identical to that of the amplification transistor 6 of the inverting amplifier 8 of the switched capacitor amplifier 4 and a second constant-current load transistor 17 that has a structure identical to that of the constant-current load transistor 7 of the inverting amplifier 8 of the switched capacitor amplifier 4.

The input and output sections of the second inverting amplifier 18 are connected together. The drain and the gate of the second reset transistor 15 are connected together, while the drain and the source of the second reset transistor 15 are connected together via a high resistance resistor 14.

The output section of the second inverting amplifier 18 and the source of the second reset transistor 15 are connected together, while the gate of the reset transistor 5 of the switched capacitor amplifier 4 shown in FIG. 1 and the drain of the second reset transistor 15 are connected together.

In this case, as shown in FIG. 1, the amplitude of the pulse φR applied to the gate of the reset transistor 5 is generally about 3 V in contrast to the voltage of about 12 V of the output drain OD. Therefore, it is necessary to superimpose a specified direct-current voltage on the pulse φR in order to short-circuit between the input and output sections of the inverting amplifier 8. However, the direct-current voltage to be superimposed has an optimum value which may be varied due to circuit processing fluctuations, power voltage fluctuations, temperature changes and so on.

Accordingly, as shown in FIG. 5, the present invention solves the problem by providing the gate application pulse generation circuit 10. That is, by fabricating the second inverting amplifier 18 of the structure identical to that of the inverting amplifier 8 on the same semiconductor substrate and connecting together the input and output sections of the second inverting amplifier 18, it is possible to generate a virtual reset drain voltage. Further, by fabricating the second reset transistor 15 of the structure identical to that of the reset transistor 5 on the same semiconductor substrate and connecting together the gate and the drain of the second reset transistor 15, it is possible to generate the application pulse φR on which the direct-current voltage is superimposed from the input pulse φRST on which no direct-current voltage is superimposed.

As described above, the superimposed direct-current voltage receives the influences of processing fluctuations, power voltage fluctuations, temperature changes and so on in exactly the same way as the inverting amplifier 8 and the reset transistor 5 connected to the detection diode 2. Thereby, an optimum direct-current voltage is consistently superimposed, which assures satisfactory operation.

Concerning the reset pulse generation circuit that employs a transistor of the structure identical to that of the reset transistor, the inventor of the present invention has already obtained patents (JP 3439581 and JP 3415775).

Second Embodiment

Figure 6:
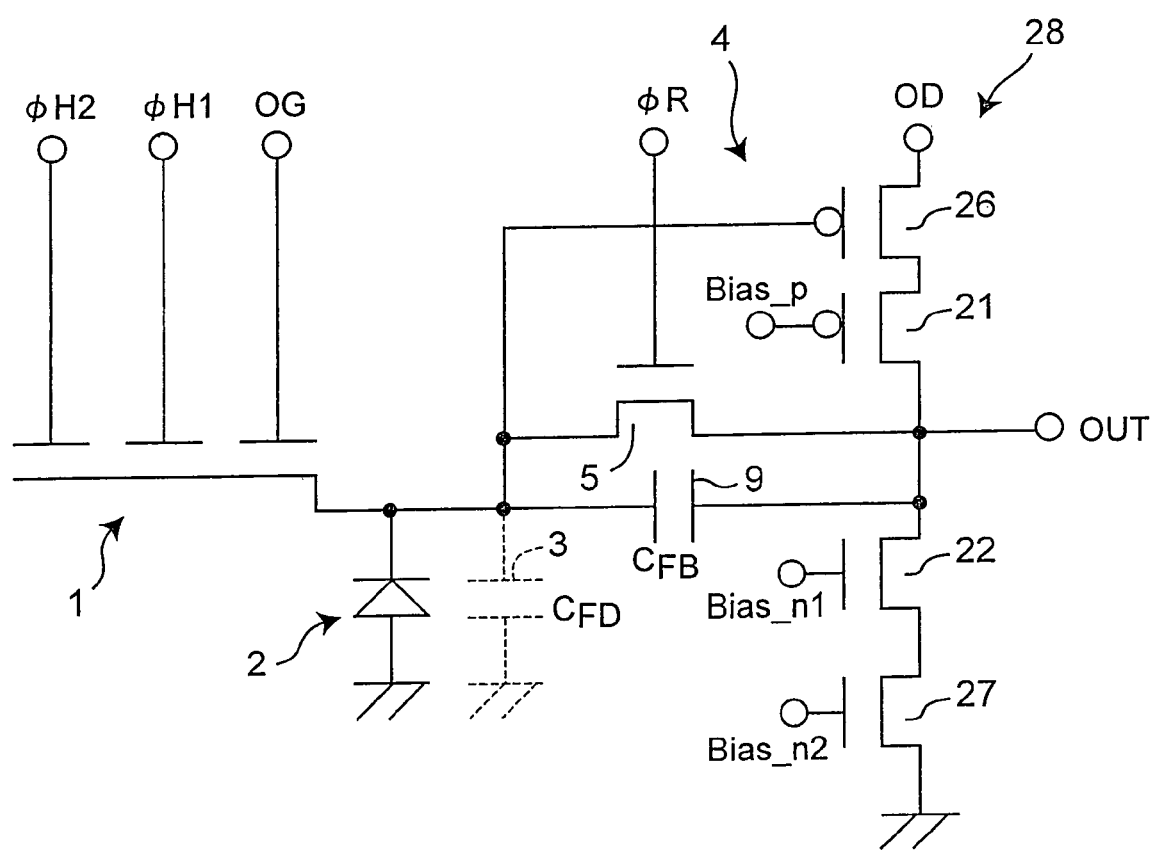
FIG. 6 is a circuit diagram showing a solid-state image pickup device according to a second embodiment of the present invention.

FIG. 6 is a circuit diagram showing a solid-state image pickup device according to a second embodiment of the present invention. In the second embodiment, the construction of the inverting amplifier differs from that of the first embodiment shown in FIG. 1, whereas the other circuits and timing chart of drive pulses are same. Thus, in FIG. 6, the same structures as those of FIG. 1 are denoted by the same reference numerals, and no description is provided therefor.

As shown in FIG. 6, a inverting amplifier 28 is a cascode type inverting amplifier, which orderly includes an amplification transistor 26, a Pch cascode transistor 21, an Nch cascode transistor 22 and a constant-current load transistor 27.

The gain A of the cascode type inverting amplifier 28 is expressed as:

$$A = gm1 \cdot [(gm2 \cdot rop1 \cdot rop2) // (gm3 \cdot ron3 \cdot ron4)] \quad \text{(Ex. 9)}$$

where gm1 is the transconductance of the amplification transistor 26, gm2 is the transconductance of the Pch cascode transistor 21, and gm3 is the transconductance of the Nch cascode transistor 22. Moreover, rop1 is the output resistance of the amplification transistor 26, rop2 is the output resistance of the Pch cascode transistor 21, ron3 is the output resistance of the Nch cascode transistor 22, and ron4 is the output resistance of the constant-current load transistor 27.

The value of the gain A of the cascode type inverting amplifier 28 is tens of times as large as the gain of the inverting amplifier of the constant-current-load source-grounded type shown in FIG. 1. Therefore, the detection capacitor's value $C_{FD}$ expressed in (Ex. 5) is not influenced at all.

Third Embodiment

Figure 7:
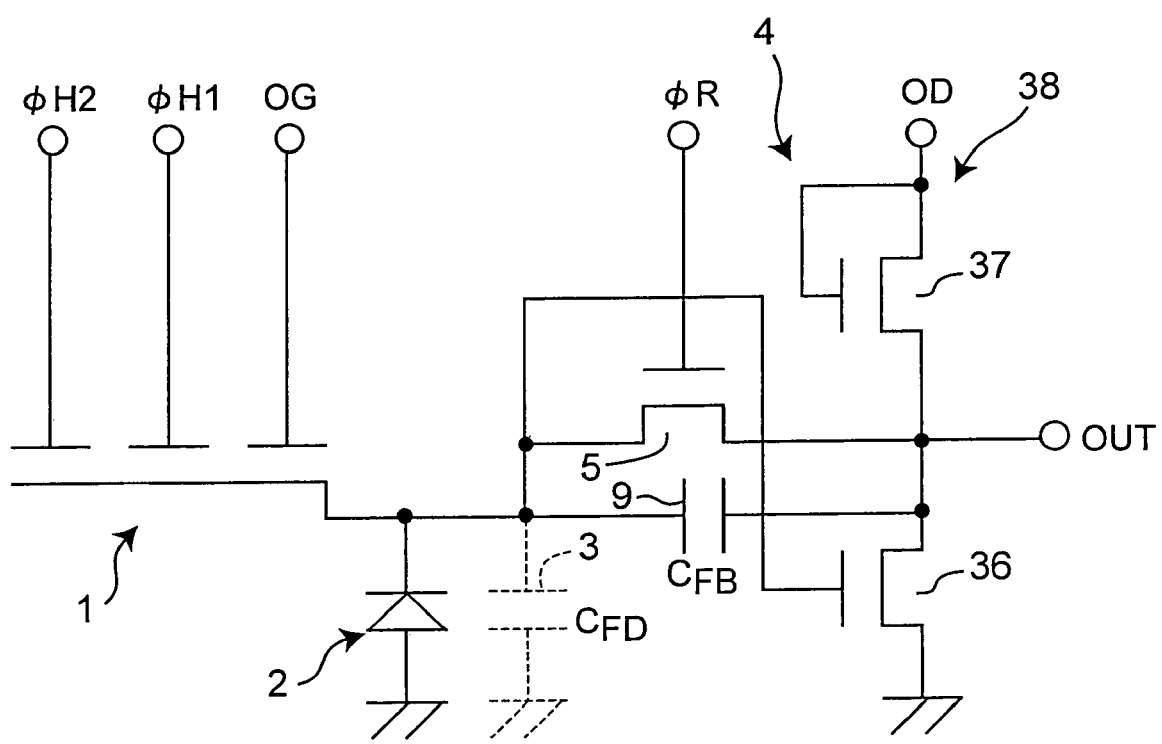
FIG. 7 is a circuit diagram showing a solid-state image pickup device according to a third embodiment of the present invention.
Figure 8:
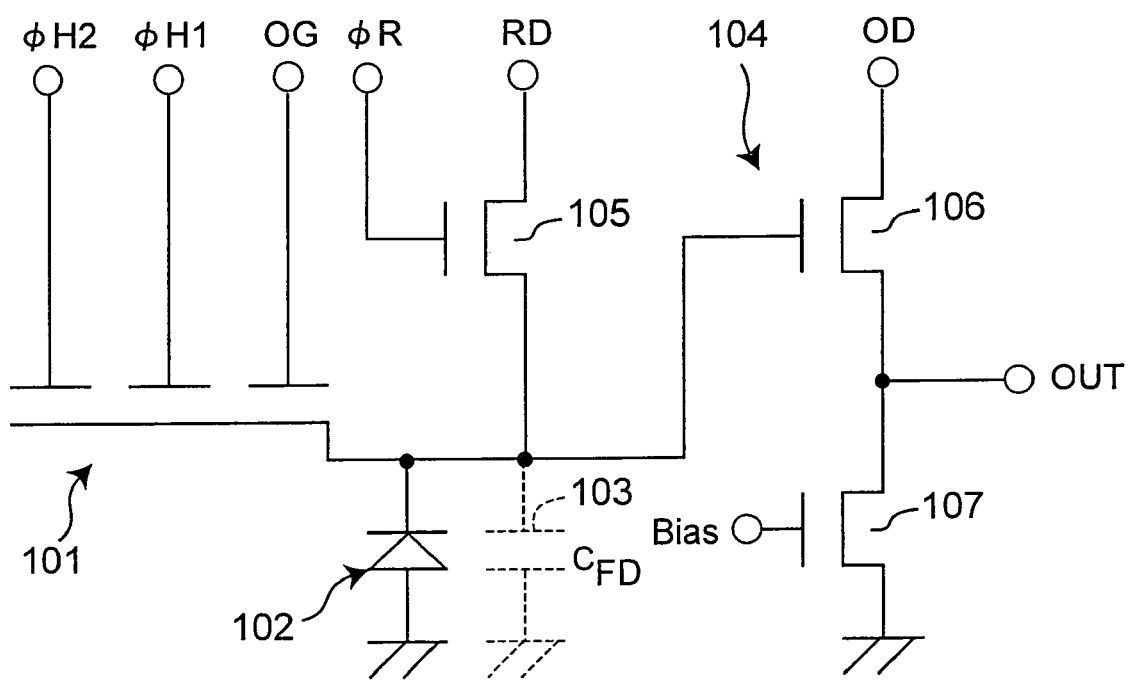
FIG. 8 is a circuit diagram of a conventional solid-state image pickup device.
Figure 9:
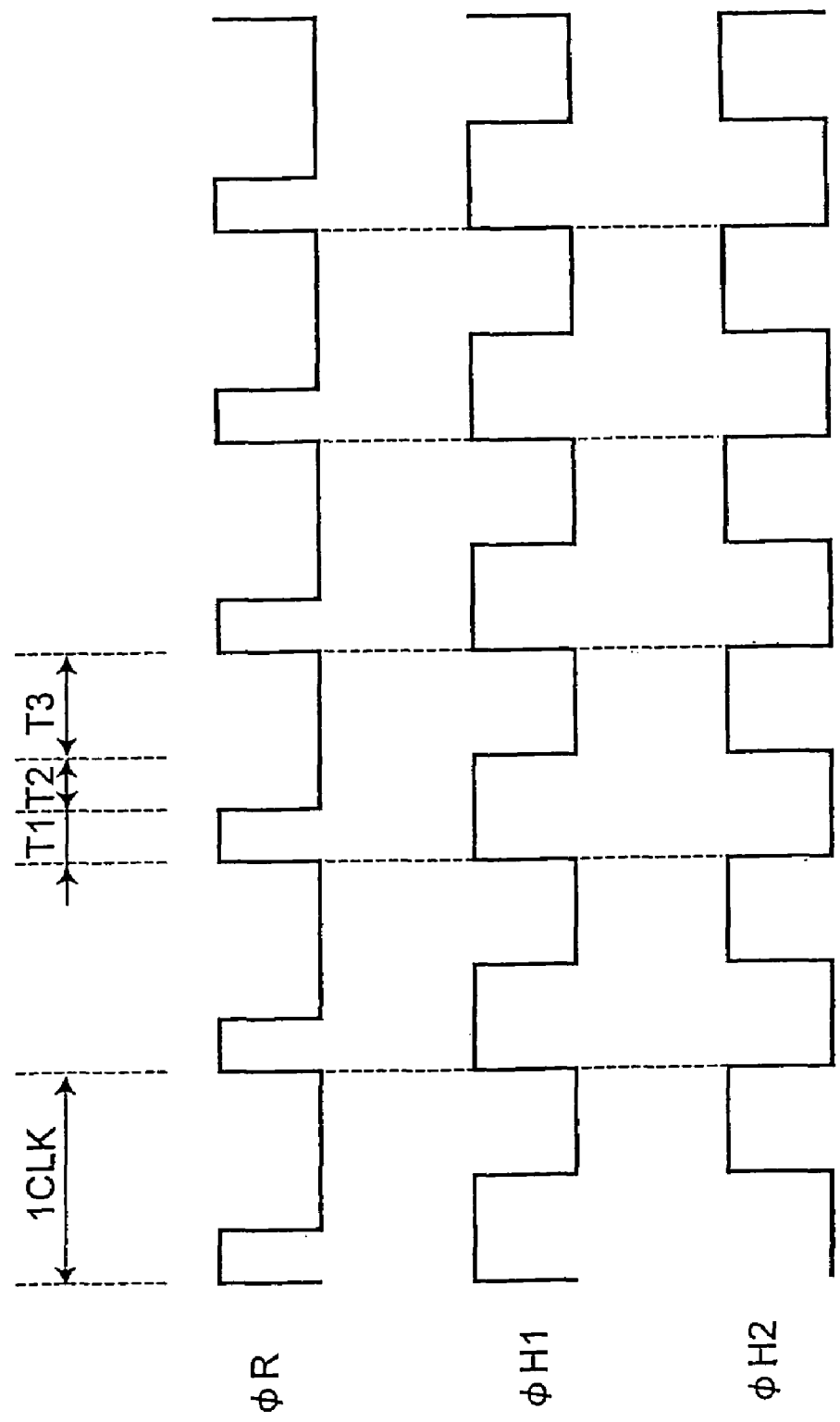
FIG. 9 is a timing chart of drive pulses of FIG. 8.

FIG. 7 is a circuit diagram showing a solid-state image pickup device according to a third embodiment of the present invention. The third embodiment differs from the first embodiment shown in FIG. 1 in the construction of the inverting amplifier, but the other circuits and the timing chart of drive pulses are same. Thus, in FIG. 7, the same structures as those of FIG. 1 are denoted by the same reference numerals, and no description is provided therefor.

As shown in FIG. 7, an inverting amplifier 38 includes an amplification transistor 36 and a load transistor 37. The load transistor 37 is of the same type (both are Nch type in this case) as that of the amplification transistor 36. The gate and the drain of the load transistor 37 are connected together.

Given that the gate size of the amplification transistor 36 is (W/L)1 and that the gate size of the load transistor 37 is (W/L)2, the gain A of the inverting amplifier 38 is expressed as:

$$A = \sqrt{[(W/L)1/(W/L)2]} \quad \text{(Ex. 10)}$$

Although the value of the gain A of the inverting amplifier 38 is lower than that of the gain of the inverting amplifier of the constant-current-load source-grounded type shown in FIG. 1, it is advantageous that Pch transistors need not be fabricated.

The invention being thus described, it will be obvious that the invention may be varied in many ways. Such fluctuations are not be regarded as a departure from the spirit and scope of the invention, and all such modifications as would be obvious to one skilled in the art are intended to be included within the scope of the following claims.

What is claimed is:

1. A solid-state image pickup device comprising:
    a plurality of photoelectric conversion elements;
    a plurality of charge transfer elements for transferring photoelectric charge generated in the plurality of photoelectric conversion elements;
    a detection diode for detecting the photoelectric charge transferred by the plurality of charge transfer elements; and
    a switched capacitor amplifier whose input section is connected to the detection diode, wherein the switched capacitor amplifier includes:
        an inverting amplifier whose input section is connected to the detection diode;
        a reset transistor connected between an input section and an output section of the inverting amplifier; and
        a capacitor connected between the input section and the output section of the inverting amplifier and parallel to the reset transistor, and
    a gate application pulse generation circuit for generating a gate application pulse of the reset transistor, wherein the gate application pulse generation circuit includes:
        a second inverting amplifier of a structure identical to that of the inverting amplifier of the switched capacitor amplifier; and
        a second reset transistor of a structure identical to that of the reset transistor of the switched capacitor amplifier.

2. The solid-state image pickup device as claimed in claim 1, wherein
    an input section and an output section of the second inverting amplifier are connected together
    a drain and a gate of the second reset transistor are connected together,
    the drain and source of the second reset transistor are connected together through a high resistance resistor
    the output section of the second inverting amplifier and the source of the second reset transistor are connected together, and
    the gate of the reset transistor of the switched capacitor amplifier is connected to the drain of the second reset transistor.

* * * * *